United States Patent

(12) United States Patent
Lo

(10) Patent No.: US 8,946,734 B2
(45) Date of Patent: Feb. 3, 2015

(54) METHOD FOR PACKAGING LIGHT EMITTING DIODES AND LIGHT EMITTING MODULE HAVING LED PACKAGES FORMED BY THE METHOD

(75) Inventor: Hsing-Fen Lo, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 30 days.

(21) Appl. No.: 13/457,553

(22) Filed: Apr. 27, 2012

(65) Prior Publication Data

US 2013/0015472 A1 Jan. 17, 2013

(30) Foreign Application Priority Data

Jul. 15, 2011 (CN) .......................... 2011 1 0198810

(51) Int. Cl.
*H01L 33/08* (2010.01)
*H01L 33/44* (2010.01)
*H01L 33/52* (2010.01)
*H01L 25/075* (2006.01)

(52) U.S. Cl.
CPC ............. *H01L 25/0753* (2013.01); *H01L 33/52* (2013.01); *H01L 2933/005* (2013.01)
USPC .............. 257/88; 257/E33.061; 257/E33.059; 257/98; 438/27

(58) Field of Classification Search
CPC combination set(s) only.
See application file for complete search history.

(56) References Cited

U.S. PATENT DOCUMENTS

| | | | |
|---|---|---|---|
| 2005/0077839 A1* | 4/2005 | Ho | ................................ 315/291 |
| 2005/0212007 A1 | 9/2005 | Dnaiels et al. | |
| 2005/0214963 A1 | 9/2005 | Daniels et al. | |
| 2008/0094828 A1 | 4/2008 | Shao | |
| 2008/0157333 A1 | 7/2008 | Lin et al. | |
| 2011/0006316 A1 | 1/2011 | Ing et al. | |
| 2013/0153946 A1* | 6/2013 | Denda et al. | .................... 257/98 |

FOREIGN PATENT DOCUMENTS

| | | |
|---|---|---|
| CN | 200982547 Y | 11/2007 |
| CN | 101088140 A | 12/2007 |
| EP | 1580818 A | 9/2005 |
| TW | 200830572 A | 7/2008 |
| TW | 200935621 A | 8/2009 |
| TW | 201019514 A | 5/2010 |
| TW | 201103120 A | 1/2011 |

\* cited by examiner

*Primary Examiner* — Hrayr A Sayadian
(74) *Attorney, Agent, or Firm* — Novak Druce Connolly Bove + Quigg LLP

(57) ABSTRACT

A method for making a light emitting module includes: a. providing a flexible substrate; b. forming a plurality of rigid portions in the flexible substrate; c. forming an electrically conductive layer on the rigid portions, the electrically conductive layer having several electrodes apart from each other; d. arranging a plurality of LED dies on the electrically conductive layer with each LED die striding over and electrically connected to two neighboring electrodes; e. forming an encapsulating layer to cover the LED dies; and f. cutting through the flexible substrate. At least one of above steps b, c, d, e is performed by a roll applying process.

8 Claims, 8 Drawing Sheets

METHOD FOR PACKAGING LIGHT EMITTING DIODES AND LIGHT EMITTING MODULE HAVING LED PACKAGES FORMED BY THE METHOD

BACKGROUND

1. Technical Field

The present disclosure generally relates to a method for packaging light emitting diodes and a light emitting module employing LED packages made by the method.

2. Description of Related Art

In recent years, due to excellent light quality and high luminous efficiency, light emitting diodes (LEDs) have increasingly been used as substitutes for incandescent bulbs, compact fluorescent lamps and fluorescent tubes as light sources of illumination devices.

During packaging process of the LEDs, a plurality of elements, such as LED dies, electrodes, encapsulations and so on, are mounted on a substrate which has a large estate area beforehand. As such, how to assemble the numerous elements together with high speed and low cost is an important research and development (R&D) subject.

Therefore, what is needed is to provide an LED packaging method capable of effectively achieve the above prospect.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Figure 1:
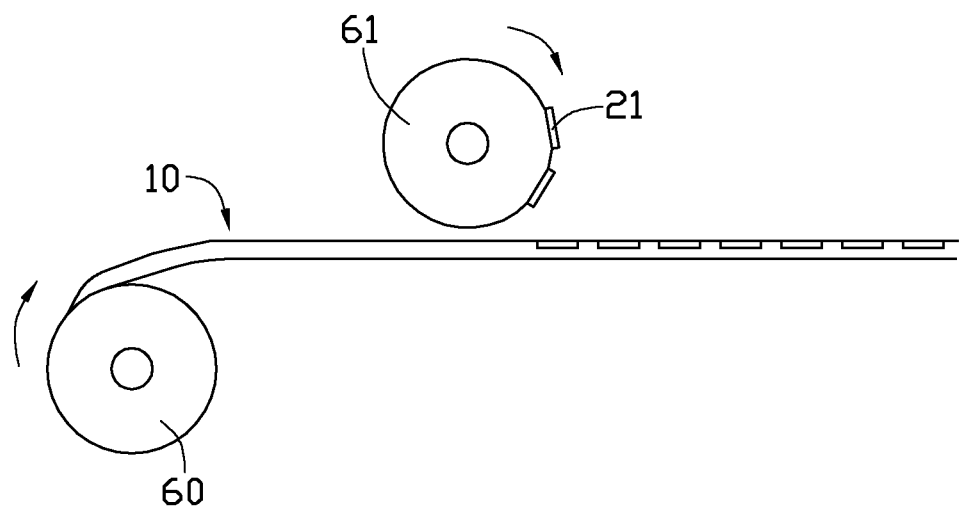
FIG. 1-FIG. 4 are schematic views showing steps of a method for packaging LEDs of the present disclosure.

Reference will now be made to the drawings to describe the present LED packaging method, in detail.

Referring to FIG. 1-FIG. 4, a method for packaging LEDs comprises the following steps.

Step 1: providing a flexible substrate 10;

Step 2: forming a plurality of rigid portions 21 on the flexible substrate 10;

Step 3: forming an electrically conductive layer 30 on the rigid portions 21, the electrically conductive layer 30 having a plurality of electrodes 31 apart from each other, wherein one electrode 31 strides over two neighboring rigid portions 21;

Step 4: arranging a plurality of LED dies 40 on the electrically conductive layer 30 with each LED die 40 striding over and electrically connected to two neighboring electrodes 31, wherein one LED die 40 is located over a corresponding rigid portion 21;

Step 5: forming an encapsulating layer 50 to cover the LED dies 40; and

Step 6: cutting through the flexible substrate 10 to obtain a plurality of LED packages.

In step 1, the flexible substrate 10 is made of electrically insulating material.

In step 2, a first roller 60 and a second roller 61 are provided together with the flexible substrate 10 extending from the first roller 60 through a place below the second roller 62. The flexible substrate 10 can be made of polymer or plastic. Then, a plurality of rigid portions 21 apart from each other are formed on the flexible substrate 10 by pressing. As illustrated in FIG. 1, the flexible substrate 10 is winded on the first roller 60 and pulled to move from left to right, and the second roller 61 is equipped with a plurality of rigid portions 21 and rotates clockwise to press the rigid portions 21 into the flexible substrate 10 during the movement thereof. It is understood that, for simplicity, only the first and second roller 60, 61 are shown in FIG. 1 and other possible transmission mechanisms are omitted. In this embodiment, the rigid portions 21 are made of silica ($SiO_2$) with high light permeability and sufficient hardness, thereby enhancing structural strength of the later-formed LED packages without hindering light extraction.

Figure 2:
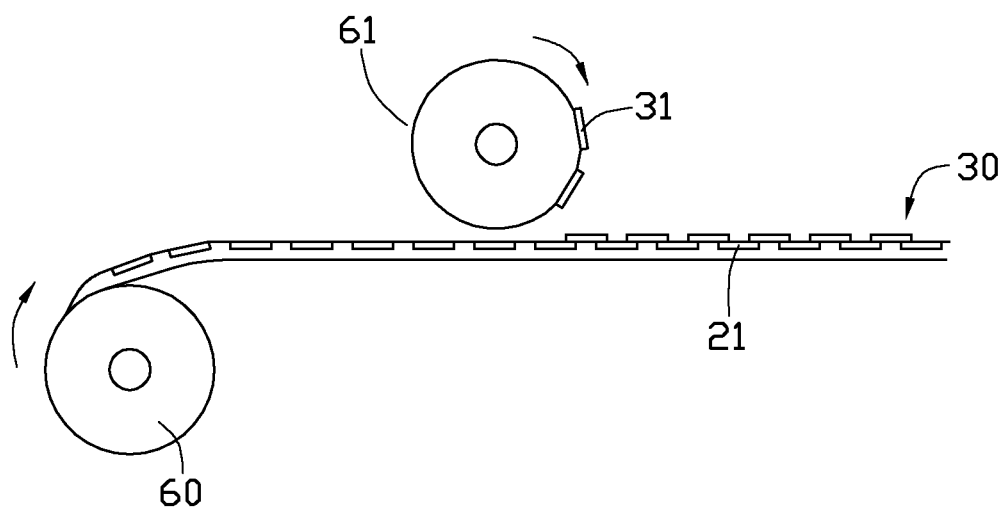

In step 3, the electrically conductive layer 30 is formed by a roll applying process to cover the rigid portions 21. The electrically conductive layer 30 includes a plurality of electrodes 31 apart from each other. As illustrated in FIG. 2, the flexible substrate 10 applied with rigid portions 21 is pulled to move from left to right; the second roller 61 is equipped with an electrically conductive layer 30 having a plurality of spaced electrodes 31; the second roller 61 rotates clockwise to press the electrodes 31 onto the flexible substrate 10 during the movement thereof. The electrodes 31 are apart from each other, and each traverses two corresponding neighboring rigid portions 21. In this embodiment, the electrically conductive layer 30 can be a plastic layer doped with electrically conductive particles by epitaxy, pervasion, or ion implant. It is understood that the electrically conductive layer 30 can also be made of metal.

Figure 3:
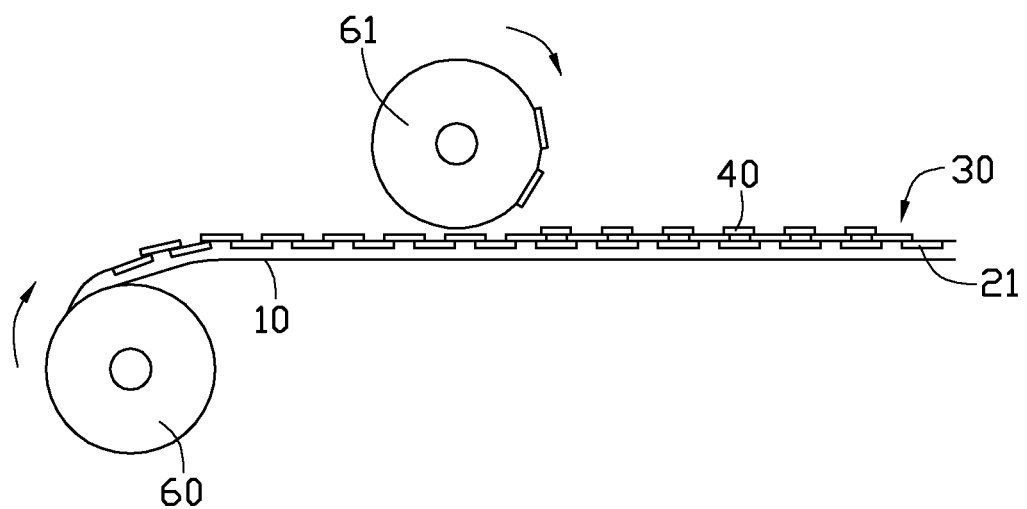

In step 4, the electrodes 31 of the electrically conductive layer 30 each are coated with conductive adhesive or solder, and then a plurality of LED dies 40 is mounted on the electrodes 31 by a roll applying process. As illustrated in FIG. 3, the flexible substrate 10 applied with rigid portions 21 and electrodes 31 is pulled to move from left to right, the second roller 61 is equipped with a plurality of LED dies 40, and the second roller 61 rotates clockwise to press the LED dies 40 onto the electrodes 31 during the movement of the flexible substrate 10. In this embodiment, the LED die 40 is arranged on and electrically connected to the electrodes 31 by flip chip. It is understood that, the LED die 40 can also be electrically connected to the electrodes 31 by wire bonding.

Figure 4:
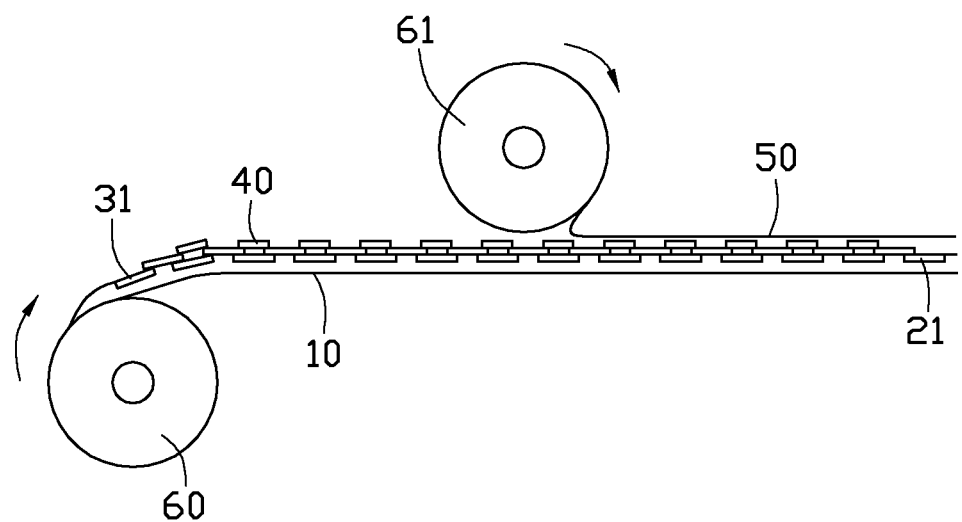

In step 5, the encapsulating layer 50 is formed by a roll applying process to cover the LED dies 40. As illustrated in FIG. 4, the flexible substrate 10 applied with LED the dies 40 is pulled to move from left to right, the second roller 61 is equipped with an encapsulating layer 50, and the second roller 61 rotates clockwise to press the encapsulating layer 50 onto the exposed surfaces of the LED dies 40 and the electrodes 31 during the movement of the flexible substrate 10. In this embodiment, the encapsulating layer 50 is made of silicone doped with fluorescent substance, such as garnet-based fluorescent, silicate-based fluorescent, sulfide-base fluorescent, thiogallate-based fluorescent, nitrogen oxide-based fluorescent, nitride-based fluorescent or combination thereof. Furthermore, the encapsulating layer 50 can be formed to define a plurality of areas with various fluorescent doping concentrations. Each area faces a corresponding LED die 40 whereby by only one packaging step the LED packages can emit light of different colors.

In step 6, the flexible substrate 10 applied with rigid portions 21, electrically conductive layer 30, LED dies 40 and encapsulating layer 50 is cut into a plurality of dices.

Figure 5:
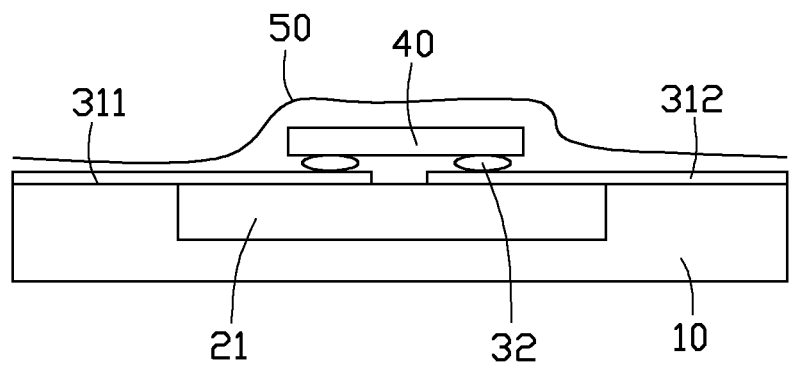
FIG. 5 and FIG. 6 are schematic views showing completed LED packages made by the packaging method of the present disclosure.
Figure 6:
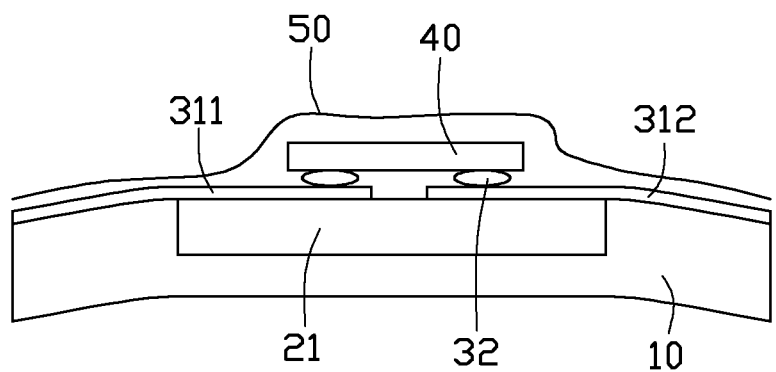

Referring to FIG. 5, an LED package made by above introduced method is illustrated. The rigid portion 21 is embedded in a top surface of the flexible substrate 10. The rigid portion 21 has a top surface coplanar with that of the flexible substrate 10. The electrically conductive layer 30 is formed on top surfaces of the flexible substrate 10 and the rigid portion 21. The electrically conductive layer 30 includes a first electrode 311 and a second electrode 312. The first and second electrodes 311, 312 each include a proximal end partly covers the rigid portion 21, with a middle part of the rigid portion 21 exposed therebetween. The LED die 40 is electrically connected to the first and second electrodes 311, 312 by solder balls 32. Referring to FIG. 6, the LED package can be bent to a degree, whereby the LED package can be mounted on a curved surface.

Figure 7:
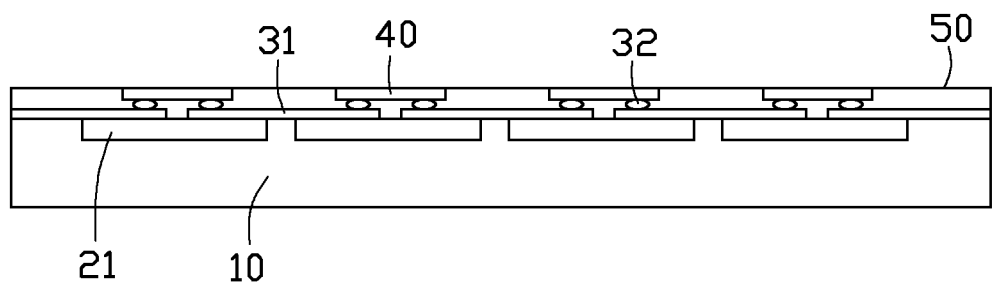
FIG. 7 is a schematic view of a light emitting module employing LED packages made by the packaging method of the present disclosure.

It is understood that, the flexible substrate 10 can also be cut into a plurality of dices each including a plurality of LED dies 40 which together work as a light emitting module, as illustrated in FIG. 7. The light emitting module includes a plurality of LED packages aligned on one line to function as an LED light bar. The plurality of LED packages employs a common electrically conductive layer 30 which includes a plurality of electrodes 31. Each electrode 31 traverses the rigid portions 21 of two neighboring LED packages, and each electrode 31 functions as a common electrode of the two neighboring LED packages.

Figure 8:
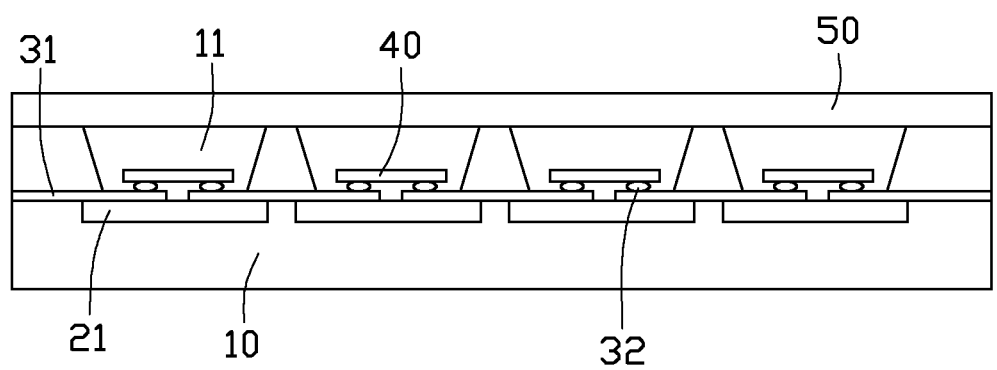
FIG. 8 is a schematic view of another light emitting module employing LED packages made by the packaging method of the present disclosure.

Besides, the above introduced LED packaging method can further includes a step of forming a plurality of cup-like structures 11 on the electrodes 31, after step 3 and before step 4. The cup-like structures 11 expose parts of the electrodes 31 for supporting the LED dies 40. Correspondingly, in latter step 5, the encapsulating layer 50 is formed in the cup-like structure 11 to cover the LED dies 40. A light emitting module consisting of a plurality of LED packages made by this alternative embodiment is illustrated in FIG. 8. The light emitting module includes a plurality of cup-like structures 11 formed on the electrodes 31 of the electrically conductive layer 30. The cup-like structures 11 each receive a corresponding LED die 11 therein, and an encapsulating layer 50 is formed on the cup-like structures 11 to cover the LED dies 40. The encapsulating layer 50 can include a plurality of areas with various fluorescent doping concentrations, wherein each area faces a corresponding LED die 40.

Due to that the layers of LED package each are formed by a respective roll applying process which makes the whole LED packing method very simple and ideal for producing a product with a constant profile and unlimited length, high efficiency and low cost of LED packaging is achieved.

It is to be noted that, the steps of above LED packaging method is not limited to be all performed by a roll applying process, the manufacture efficiency and cost can be significantly improved as long as at least one of the steps is performed by a roll applying process, and the above introduced steps are all performed by roll applying processes to achieve the optimal efficiency.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A method for making a light emitting module, comprising steps of:
   a. providing a flexible substrate;
   b. forming a plurality of rigid portions in the flexible substrate;
   c. forming an electrically conductive layer on the rigid portions, the electrically conductive layer having several electrodes apart from each other and each electrode striding over two neighboring rigid portions;
   d. arranging a plurality of LED dies on the electrically conductive layer with each LED die striding over and electrically connected to two neighboring electrodes;
   e. forming an encapsulating layer to cover the LED dies; and
   f. cutting through the flexible substrate to obtain the light emitting module which includes at least two rigid portions and at least two LED dies over the at least two rigid portions, wherein at least one of above steps b, c, d is performed by a roll applying process.

2. The method for making light emitting module of claim 1, wherein the encapsulating layer comprises a plurality of areas with various fluorescent doping concentrations.

3. The method for making light emitting module of claim 1, wherein conductive adhesive is coated on the electrodes before arranging the LED dies.

4. The method for making light emitting module of claim 1, wherein said each LED die is electrically connected to two neighboring electrodes by flip-chip.

5. The method for making light emitting module of claim 1, wherein said each LED die is electrically connected to two neighboring electrodes by wire bonding.

6. The method for making light emitting module of claim 1, wherein the plurality of rigid portions are embedded in a top surface of the flexible substrate, and the plurality of rigid portions each have a top surface coplanar with a top surface of the flexible substrate.

7. The method for making light emitting module of claim 1, wherein the plurality of rigid portions are apart from each other and formed on the flexible substrate by pressing.

8. The method for making light emitting module of claim 1, wherein the light emitting module is bent to a degree and mounted on a curved surface.

\* \* \* \* \*